United States Patent
Feustel et al.

(10) Patent No.: US 8,174,010 B2
(45) Date of Patent: May 8, 2012

(54) UNIFIED TEST STRUCTURE FOR STRESS MIGRATION TESTS

(75) Inventors: Frank Feustel, Dresden (DE); Pascal Limbecker, Dresden (DE); Oliver Aubel, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 570 days.

(21) Appl. No.: 11/949,993

(22) Filed: Dec. 4, 2007

(65) Prior Publication Data

US 2008/0265247 A1 Oct. 30, 2008

(30) Foreign Application Priority Data

Apr. 30, 2007 (DE) .................. 10 2007 020 257

(51) Int. Cl.
*H01L 23/58* (2006.01)
*H01L 29/10* (2006.01)

(52) U.S. Cl. .......... 257/48; 257/211; 257/529; 257/536; 257/E23.179; 257/E21.522; 324/525; 324/537

(58) Field of Classification Search .................... 257/48, 257/E21.521; 438/14, 17, 18; 324/71.1, 324/71.5, 525

See application file for complete search history.

(56) References Cited

U.S. PATENT DOCUMENTS

| 6,570,181 | B1 * | 5/2003 | Graas et al. ...................... 257/48 |
| 7,081,758 | B2 | 7/2006 | Umemura et al. ............ 324/537 |
| 2003/0034558 | A1 * | 2/2003 | Umemura et al. ............ 257/734 |
| 2003/0226121 | A1 * | 12/2003 | Yokogawa ........................ 716/1 |
| 2004/0207383 | A1 * | 10/2004 | Wang ........................... 324/71.2 |

OTHER PUBLICATIONS

Transmittal Letter from Foreign Associate dated Feb. 19, 2008.
Translation of Official Communication Issued Jan. 15, 2008.
Transmittal Letter from Foreign Associate dated Jun. 10, 2008.
Translation of an Official Communication Issued Jun. 10, 2008.

* cited by examiner

*Primary Examiner* — Davienne Monbleau
*Assistant Examiner* — Leslie Pilar Cruz
(74) *Attorney, Agent, or Firm* — Williams, Morgan & Amerson, P.C.

(57) ABSTRACT

A unified test structure which is applicable for all levels of a semiconductor device including a current path chain having a first half chain and a second half chain, wherein each half chain comprises lower metallization segments, upper metallization segments, an insulating layer between the lower metallization segments and the upper metallization segments, and connection segments. Each of the connection segments is electrically connected to a contact region of one of the lower metallization segments and to a contact region of one of the upper metallization segments to thereby electrically connect the respective lower metallization segment and the respective upper metallization segment, and the first half chain and the second half chain are of different configuration.

19 Claims, 3 Drawing Sheets

UNIFIED TEST STRUCTURE FOR STRESS MIGRATION TESTS

BACKGROUND OF THE INVENTION

1. Field of the Invention

The subject matter disclosed herein relates to the field of fabrication of microstructures, and, more particularly, to a test structure for process qualification of a metallization process in integrated circuit manufacturing.

2. Description of the Related Art

In microstructures such as integrated circuits, a large number of circuit elements, such as transistors, capacitors and resistors, are fabricated on a single substrate by depositing semiconductive, conductive and insulating material layers and patterning those layers by photolithography and etch techniques. In subsequent manufacturing steps, the individual circuit elements may be electrically connected by means of metal lines that are embedded in a dielectric, thereby forming what is usually referred to as a metallization layer. In modern integrated circuits, a plurality of such metallization layers is typically provided, wherein the layers are stacked on top of each other to obtain the required functionality. Failure of these metal lines may lead to a failure of part or the whole semiconductor device. Therefore, the reliability and quality of the metal lines is of particular interest and is even more important for highly integrated circuit devices having reduced dimensions of the circuit elements as well as of the metal lines.

In general, subsequent material layers should exhibit good adhesion to each other while at the same time maintaining the integrity of each individual layer, i.e., chemical reaction of adjacent layers and/or diffusion of atoms from one layer into the other layer should be avoided during the manufacturing processes for the fabrication of the individual layers and subsequent processes as well as afterwards when operating the completed device. To meet these requirements, often an intermediate layer is required to provide good adhesion and to suppress diffusion and thus undue interference between neighboring materials during processing and operation. A typical example for such requirements in the fabrication of semiconductor devices is the formation of interconnect plugs, wherein openings having a bottom region and a sidewall region have to be provided with a corresponding intermediate layer, that is, a conductive barrier layer, so that a subsequently deposited conductive material exhibits good adhesion to the surrounding dielectric layer and undue interaction during processing and operation may be avoided. The same requirements should be met for the metallization layers to which the interconnect plugs are connected. In advanced semiconductor devices, the interconnect plugs are typically formed of a tungsten-based material and provided in an interlayer dielectric stack which is typically comprised of silicon dioxide including a bottom etch stop layer typically formed of silicon nitride. In other semiconductor devices, the interconnect plugs may be formed of a copper-based material. Depending on the material used for the plugs, an appropriate barrier material has to be chosen, examples of which are well known in the art. For example, for a tungsten-based material plug, a barrier layer of titanium/titanium nitride may be used, whereas for a copper-based material plug, a barrier layer comprising tantalum and/or tantalum nitride may be used. In modern integrated circuits, openings (so-called vias) are formed exhibiting an aspect ratio that may be as high as approximately 8:1 or more, and the opening may have a diameter of 0.1 µm or smaller. The aspect ratio of such openings is generally defined as the ratio of the depth of the opening to the width of the opening.

The metal lines of the metallization layers may be formed of the same materials as the interconnect plugs. For example, the contact holes (vias) as well as trenches for the metal lines may be etched and subsequently filled by the same deposition process of the conductive material(s), which is usually referred to as a double damascene process. In other semiconductor devices, the metal lines are formed separate from the interconnect plugs. Typical materials for the metal lines are copper-based materials or aluminum-based materials.

In order to facilitate the testing of the metallization structures including the metal lines of the metallization layers as well as the interconnect plugs, test structures are typically provided which are formed on the same wafer as the integrated circuit and which are formed by the same processes used for the fabrication of the semiconductor devices on the wafer. Typically, these test structures are provided for mechanical integrity tests as well as electromigration or stress-induced voiding tests and typically employ open-ended chains of alternating metal levels. The testing of such test structures is generally limited by the number of available bond pads that may be connected to points on the test structure.

One point of interest may be electromigration in the test structure. Electromigration is the migration of metal atoms in a conductor due to electrical current. Material transport due to electromigration may give rise to voids and hillocks which can cause open or short circuit failure. Generally, electromigration depends on the current density as well as on the geometry of the respective conductors. For example, a higher current density increases the material transport due to electromigration. Further, there exists a certain length of conductor known as Blech length, below which electromigration does not occur because the material transporting forces due to the electrical current are at least partially compensated by a developing mechanical stress.

A further point of interest is stress migration, i.e., a material transport in a conductor due to a mechanical stress. Such a mechanical stress may arise due to a change in temperature wherein the different thermal extension of the conductive materials and the surrounding dielectric generate a large mechanical stress. For testing stress migration failure, the test structure may be heated to a temperature in a range from, e.g., about 150-350° C. Usually the testing temperature is higher than the temperature of the semiconductor device during operation in order to achieve a stress migration result in reasonable time. In order to heat the test structure, it may be placed within a heating chamber and a resistance meter may be coupled to the test structure for measuring resistance across the test structure such that the formation of a void within the test structure due to stress migration causes an increase in the resistance measured by the resistance meter. In other testing environments, the time to stress migration failure of a test structure is reduced by continuously conducting a certain electrical current through the test structure that is continuously heated.

Both electromigration and stress migration are mechanisms that degrade the reliability of the semiconductor device and are therefore important parameters for the design of semiconductor devices.

Current stress migration structures are represented in numerous different structures and require a large number of electrical probe pads and usually do not allow for one hundred percent physical failure analysis.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a test structure that has a unified design which is usable across all levels of semiconductor device manufacturing.

According to one illustrative embodiment, a test structure comprises a current path chain having a first half chain and a second half chain. Each half chain comprises lower metallization segments, upper metallization segments and an insulating layer between the lower metallization segments and the upper metallization segments. Each half chain further comprises connection segments wherein each connection segment is electrically connected to a contact region of one of the lower metallization segments and to a contact region of one of the upper metallization segments to thereby electrically connect the respective lower metallization segment and the respective upper metallization segment. The first half chain and the second half chain are of different configuration.

According to another illustrative embodiment, a test structure comprises two different half chains connected in series, wherein each half chain comprises metallization segments of two different metallization layers isolated by an insulating layer. Each half chain comprises nine rows of three contact vias connecting metallization segments of the different metallization layers.

According to still another illustrative embodiment, a test structure comprises a lower metallization layer having lower metallization segments and an upper metallization layer having upper metallization segments. The test structure further comprises an insulating layer between the lower metallization segments and the upper metallization segments and connection segments, each of which is electrically connected to a contact region of one of the lower metallization segments, as well as to a contact region of one of the upper metallization segments to thereby electrically connect the respective lower metallization segment and the respective upper metallization segment. Further, at least one contact region of at least one of the metallization segments is located at an end of the respective metallization segment and at least one of the metallization segments extends beyond at least one contact region thereof.

BRIEF DESCRIPTION OF THE DRAWINGS

The disclosure may be understood by reference to the following description taken in conjunction with the accompanying drawings, in which like reference numerals identify like elements, and in which.

Figure 1A:
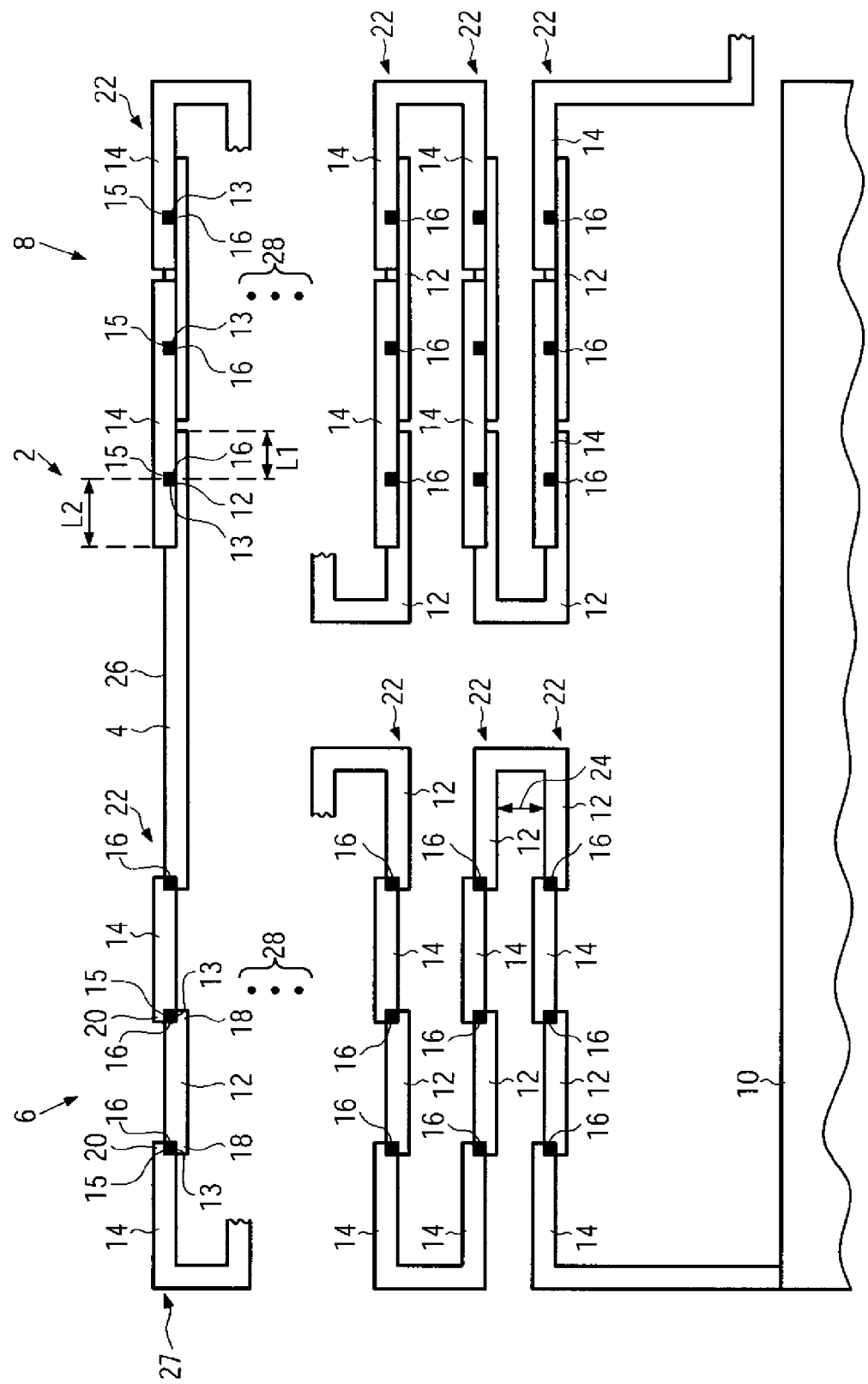
FIG. 1A schematically shows, in part, a test structure in accordance with illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to test structures for testing the reliability of electrical current paths in a semiconductor device. It should be understood that, in order to be comparable to the current path in the semiconductor device, the current path of the test structure should be formed by the same processes as used for the formation of the semiconductor device. Therefore, no specific technique for forming metallization layers, insulating layers, interconnect plugs and the like is disclosed herein since these techniques used to physically establish the respective test structure should correspond to the techniques of the semiconductor device under consideration. Rather, the general structure and advantageous features of a test structure are disclosed herein. Further, it should be understood that the test structures disclosed herein may be used with any appropriate test method.

FIG. 1A schematically shows a test structure 2 comprising a current path chain 4 having a first half chain 6 and a second half chain 8. The current path chain 4 extends between two probe pads, one probe pad 10 of which is shown in FIG. 1A. Each half chain 6, 8 comprises lower metallization segments 12 and upper metallization segments 14. The metallization segments 12, 14 may be formed of any appropriate material, e.g., a metal or a metal alloy. For example, the metallization segments 12, 14 may be formed of a copper-based material or an aluminum-based material. Between the lower metallization segments 12 and the upper metallization segments 14, an insulating layer is provided (not shown in FIG. 1A). It should be noted that FIG. 1A does not show the test structure to scale or from an elevated view. Rather, FIG. 1A is provided to illustrate some features according to illustrative embodiments disclosed herein. The lower and upper metallization segments 12, 14 may be formed of respective metallization layers, e.g., a lower metallization layer and an upper metallization layer. According to one embodiment, the lower metallization segments 12 are provided in a first level and the upper metallization segments 14 are provided in a second level different than the first level.

The first half chain 6 and the second half chain 8 further comprise connection segments 16. Each of the connection segments 16 is electrically connected to a contact region of one of the lower metallization segments 12 and to a contact region of one of the upper metallization segments 14 to thereby electrically connect the respective lower metallization segment 12 and the respective upper metallization segment 14. The connection segments 16 may be formed of conductive plugs which are formed in contact holes of the insulating layer between the lower metallization segments 12 and the upper metallization segments 14. Conductive plugs of this kind may be formed of a tungsten-based material. According to other embodiments, the conductive plugs may be formed of a copper-based material. However, it should be noted that the conductive plugs may be formed of any appropriate conducting material. The connection segments 16 which comprise the conductive plugs may further comprise barrier layers which inhibit unwanted interaction between the conductive plug and the surrounding materials, e.g., the insulating layer between the lower metallization segments 12 and the upper metallization segments 14.

In accordance with another illustrative embodiment, the first half chain 6 and the second half chain 8 are of different configuration.

In accordance with a further illustrative embodiment, in the first half chain 6, each contact region 13, 15 is located at an end 18, 20 of the respective metallization segment 12, 14. For example, in the first half chain 6, the contact region 13 of the lower metallization segments 12 is located at a respective end 18 of the lower metallization segments 12 and the contact regions 15 of the upper metallization segments 14 are located at an end 20 of the upper metallization segments 14.

In the second half chain 8, the metallization segments 12, 14 extend beyond the contact regions 13, 15 thereof as is exemplarily shown in FIG. 1A. For example, in the second half chain 8, the lower metallization segments 12 extend beyond the contact regions 13 of the lower metallization segments 12. The upper metallization segments 14 extend beyond the contact regions 20 of the upper metallization segments 14 in the second half chain 8. This configuration has the advantage that, in one test structure 2, different contacting scenarios are included such that the test structure 2 may be regarded as representative for a variety of semiconductor devices or a variety of semiconductor device portions. Further, a test structure 2 of this kind my be regarded as representative for the metallization of a variety of semiconductor devices or the metallization of a variety of semiconductor device portions.

In the embodiments of the second half chain 8 shown in FIG. 1A, the extent to which the metallization segments 12, 14 overlap its respective contact portion 13, 15 is the same. In other words, the lower metallization segments 12 overlap the contact region by a first extent L1 and the upper metallization segments 14 overlap the respective contact portions 15 by an extent L2, wherein the length L1 and L2 are approximately the same. In this sense, the second half chain 8 might be characterized as having the contact segment 16 "in the middle." In other illustrative embodiments, the overlap length L1 of the lower metallization segments 12 differs from the overlap length L2 of the upper metallization segments 14.

According to various illustrative embodiments, at least one of the first half chain 6 and the second half chain 8 are serpentine shaped having parallel chain portions 22. According to one illustrative embodiment, each of the chain portions 22 of the first half chain 6 comprises three connection segments 16. Alternatively or additionally, as shown in FIG. 1A, the chain portions 22 of the second half chain 8 may comprise three connection segments 16. According to an illustrative embodiment, both half chains, i.e., the first half chain 6 and the second half chain 8, are serpentine shaped having parallel chain portions 22. According to another illustrative embodiment, the chain portions 22 of the first half chain 6 are aligned with the chain portions 22 of the second half chain 8 as illustrated in FIG. 1A. According to an illustrative embodiment, within each of the parallel chain portions 22, the contact segments 16 are spaced by a predetermined distance. For example, the predetermined distance between the contact segments 16 within a chain portion 22 may be within 5 μm and 7 μm. According to a further illustrative embodiment, the predetermined distance is 6 μm. According to still a further illustrative embodiment, the predetermined distance between the contact segments 16 within a chain portion is constant for all chain portions 22 of the test structure 2. Accordingly, for the test structure illustrated in FIG. 1A, the distance between the left-most contact segment 16 and the right-most contact segment 16 within one chain portion 22 is 12 μm. According to one illustrative embodiment, this distance between the left-most contact segment 16 (left-most via) and the right-most contact segment 16 (right-most via) is such that all contact segments 16 of one half chain 22 are compatible with an available focused ion beam (FIB) technique such that the contact segments 16 within one chain portion fit into one focused ion beam cut. The focused ion beam (FIB) technology is a widely used tool for microelectronics. The ions strike the specimen to remove materials through a physical sputtering process. A combination of a focused ion beam and the reactive gas also causes various physical effects on the specimen. Gas molecules above a specimen may be dissociated, resulting in a local etching of the specimen. Based on this phenomena, the focused ion beam technique may be utilized for failure analysis. For failure analysis, the focused ion beam technique provides a precision cross-section at almost any location and at any angle with minimum contamination. In conjunction with other failure analysis techniques, such as scanning electron microscopy (SEM) or energy dispersive x-ray spectroscopy (EDX), the focused ion beam cut may be used for diagnosing stress migration induced failure of the test structure. The FIB cut may also be used to prepare samples for a transmission electron microscopy (TEM) analysis.

According to a still further illustrative embodiment, the parallel chain portions 22 of at least one of the half chains 6, 8 are spaced from each other by a predetermined distance 24. According to a still further illustrative embodiment, all parallel chain portions 22 of one of the half chains 6, 8 are spaced from each other by the predetermined distance 24. According to still another illustrative embodiment, the parallel chain portions 22 of both half chains 6, 8 are spaced from each other by the predetermined distance 24. According to an illustrate embodiment, the predetermined distance 24 between parallel chain portions 22 of one half chain is between 1 µm and 3 µm. According to still another embodiment, the parallel chain portions 22 within one half chain are spaced by 2 µm, i.e., the predetermined distance 24 is 2 µm. According to an illustrative embodiment, the parallel chain portions 22 are spaced from each other such that they allow for an optical beam induced resistance change (OBIRCH) technique, which uses a laser beam to induce a thermal change in a region of the test structure while measuring the resistance of the test structure. The laser stimulation highlights differences in the thermal characteristics between areas containing defects and areas which are defect-free. In particular, for performing the optical beam induced resistance change technique, a constant voltage may be applied to the test structure. An area of interest is then selected on the device and a laser beam is used to scan the area of interest. During scanning of the laser beam over the area of interest, the current being drawn by the test structure is monitored for changes. When a change in current occurs, the respective position of the laser beam indicates the location of a defect in the test structure. In particular areas containing voids, the thermal conductivity is lower, resulting in a larger change in resistance when scanning over such an area. The parallel chain portions 22 within one half chain may be aligned in a direction perpendicular to the extension of the chain portions 22, as illustrated in FIG. 1A.

According to a still further illustrative embodiment, the first half chain 6 and the second half chain 8 span a width which corresponds to a width of a probe pad, e.g., to the width of the probe pad 10 to which the first half chain 6 is electrically connected. According to still a further embodiment, the first half chain 6 is electrically connected to a first probe pad 10 and the second half chain 8 is connected to a second probe pad (not shown in FIG. 1A). The first half chain 6 and the second half chain 8 are electrically connected via a half chain connection segment 26. According to an illustrative embodiment, the two half chains 6, 8 are connected at an end 27 opposite to the probe pad 10. According to a still further embodiment, the first half chain 6 and the second half chain 8 are arranged in parallel.

As indicated by the dots 28 in FIG. 1A, each half chain 6, 8 may comprise an arbitrary number of parallel chain portions 22. For example, a half chain may comprise eight chain portions 22. According to still other illustrative embodiments, a half chain 6, 8 may comprise even less chain portions 22, e.g., three or four. According to other illustrative embodiments, a half chain may comprise nine chain portions 22 or ten chain portions 22. According to still other illustrative embodiments, a half chain 6, 8 may comprise even more chain portions 22, e.g., fifteen or twenty. According to illustrative embodiments, each half chain 6, 8 of the current path chain 4 comprise the same number of chain portions 22.

Although the chain portions 22 in FIG. 1A are arranged in parallel, according to other illustrated embodiments, the chain portions 22 of a serpentine shaped current path chain 4, which chain portions contain the connection segments 16 and are connected in series, may be arranged in a non-parallel manner.

Figure 1B:
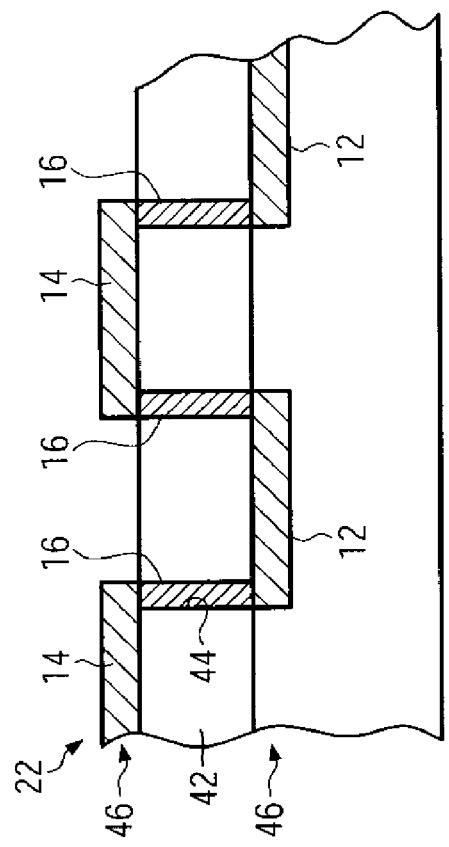
FIG. 1B schematically shows, in part, a cross-section of the test structure of FIG. 1A.

FIG. 1B shows an exemplary cross-section of a chain portion 22 of the first half chain of FIG. 1A. Lower metallization segments 12 are formed in an insulating layer 40. For example, trenches corresponding to the lower metallization segments 12 may be formed in the insulating layer 40 by using well-established photolithography and etch techniques and by subsequently filling the trenches with conductive material, for example copper-based or aluminum-based material. Subsequently, a second insulating layer 42 may be formed by well-established techniques, for example chemical vapor deposition (CVD) techniques. According to illustrated embodiments, the first insulating layer 40 and second insulating layer 42 may be formed of silicon dioxide, e.g., on the basis of TEOS.

For forming the connection segments 16 (connection vias) in the second insulating layer 42, contact holes 44 may be formed in the second insulating layer 42 by any appropriate photolithography and etch technique. Subsequently, the contact holes 44 may be covered with a barrier layer (not shown) and may then be subsequently filled with a conductive plug material to form the connection segment 16. The upper metallization segments 14 may be formed separately from the connection segments 16 or may be formed together with the connection segments 16 in one step (dual damascene). The deposition of conductive material of the connection segments 16 and the metallization segments 12, 14 may be performed according to well-established techniques, for example, CVD techniques, sputter techniques, plating, etc.

The upper metallization segments 14 may be covered with the electric layer (not shown in FIG. 1B). In the embodiment illustrated in FIG. 1B, the lower metallization segments 12 form a lower metallization layer 46 and the upper metallization segments 14 form an upper metallization layer 48. Hence, the second insulating layer 42 is formed between the lower metallization segments 12 and the upper metallization segments 14.

Figure 2:
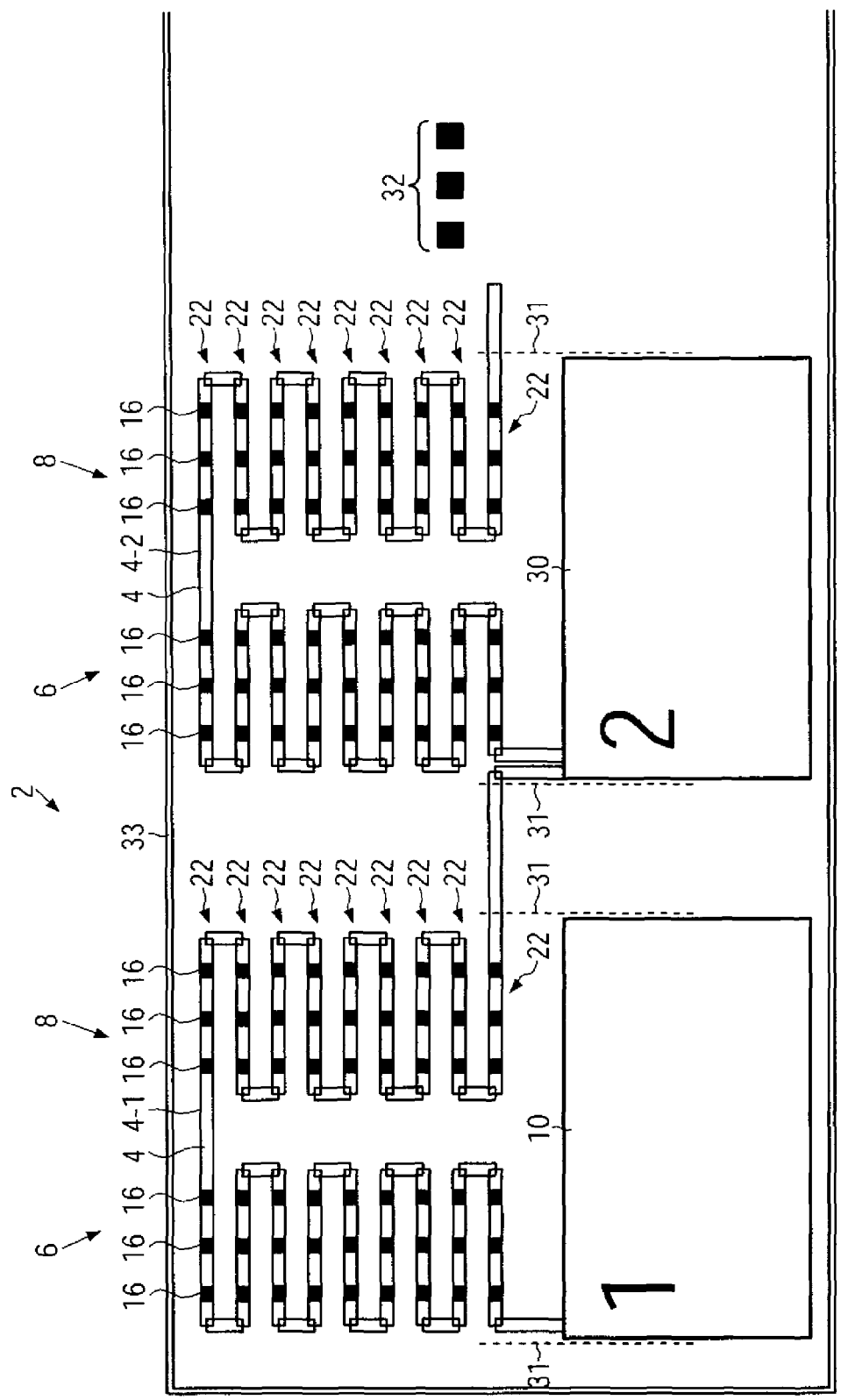
FIG. 2 schematically shows, in part, the structure in accordance with further illustrative embodiments.

According to illustrative embodiments shown in FIG. 2, each half chain 6, 8 comprises nine parallel chain portions 22. In the illustrative embodiment shown in FIG. 2, each chain portion 22 comprises three connection segments 16 (connection vias). According to an illustrative embodiment, the test structure 2 comprises at least two current path chains 4, 4-1, 4-2. Each current path chain 4 comprises a first half chain 6 and a second half chain 8, wherein, according to an illustrative embodiment, the first half chain 6 of the first current path chain 4-1 is connected to a first probe pad 10, 10-1 and the other, second half chain 8 of the first current path chain 4-1 is connected to a second probe pad 10, 10-2. Further, one half chain, for example the first half chain 6, of the second current path chain 4-2 is connected to the second probe pad 10-2. The test structure 2 illustrated in FIG. 2 may comprise two current path chains 4, 4-1, 4-2. In this case, the second half chain 8 of the second current path chain 4-2 may be connected to a third probe pad (not shown in FIG. 2). Further, according to still another illustrative embodiment, the test structure 2 shown in FIG. 2 may comprise one or more further current path chains 4 as is indicated by the dots 32. According to still another illustrative embodiment, the test structure 2 comprises at least two current path chains 4, e.g., as shown in FIG. 2, and each current path chain 4 spans a width that corresponds to the width of one probe pad 10-1, 10-2. That is, the outermost corners of each half chain are aligned with the probe pad, indicated by the dotted lines 31 in FIG. 2. According to still another embodiment, all probe pads of the test structure 2 have the same width. According to other embodiments, the width of the current path chain is smaller than the width of the corresponding probe pad. According to other illustrative embodiments, the width of the current path chain is larger than the width of the corresponding probe pad.

The test structure 2 may be located on the same substrate on which a semiconductor device is fabricated. For example, the test structure 2 may be located outside a semiconductor device region, as illustrated in FIG. 2. Here, the test structure 2 is located outside the die-seals 33 of semiconductor devices (not shown).

A test structure according to still another illustrative embodiment comprises two different half chains 6, 8 connected in series, wherein each half chain 6, 8 comprises metallization segments 12, 14 of two different metallization layers, isolated by an insulating layer 42. In this embodiment, each half chain 6, 8 comprises nine rows 22 of three contact vias 16 connecting the metallization segments 14, 16 of the different metallization layers as illustrated in FIG. 2.

A test structure according to still another illustrative embodiment comprises a lower metallization layer 46 having lower metallization segments 12 and an upper metallization layer 48 having upper metallization segments 14. The test structure 2 of this embodiment further comprises an insulating layer 42 between the lower metallization segments 12 and the upper metallization segments 14. Further, collection segments 16 are provided, each of which is electrically connected to a contact region of one of the lower metallization segments 12 and to a contact region of one of the upper metallization segments 14 to thereby electrically connect the respective lower metallization segment and the respective upper metallization segment. Further, according to this embodiment, at least one contact region 13, 15 of at least one of the metallization segments 12, 14 is located at an end 18, 20 of the respective metallization segment 12, 14 and at least one of the metallization segments 12, 14 extends beyond at least one contact region 13, 15 thereof. In this sense, the illustrative embodiments shown in FIGS. 1A and 2 can be regarded as an embodiment wherein the metallization segments 12, 14 having contact regions 13, 15 located at an end 18, 20 of the respective metallization segments 12, 14 form a first half chain 6 of a current path chain 4 and the metallization segments 12, 14 extending beyond the contact regions 13, 15 thereof form a second half chain 8 of the current path chain 4.

Figure 3:
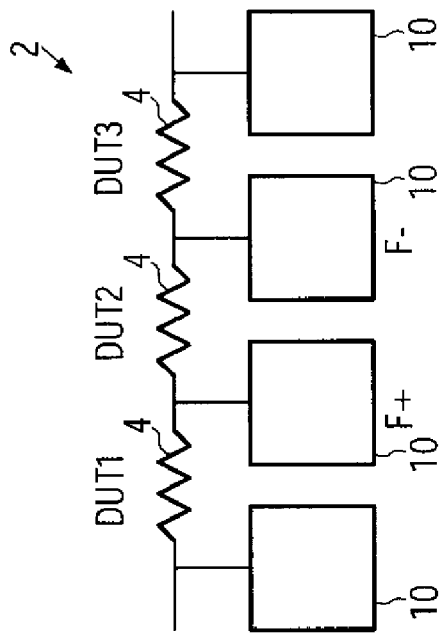
FIG. 3 schematically shows a test option in accordance with further illustrative embodiments.

FIG. 3 illustrates a first test option wherein a current path chain under test (device under test, DUT) is contacted by two vias as illustrated in FIG. 3. To this end, a driving voltage (a driving force) is applied to the probe pads designated as F+ and F− and the resultant current drawn by the current path chain DUT2 is measured via the same probe pads F+ and F−. Other current path chains (devices under test, DUT1 and DUT3) may be selectively tested in the same way.

Figure 4:
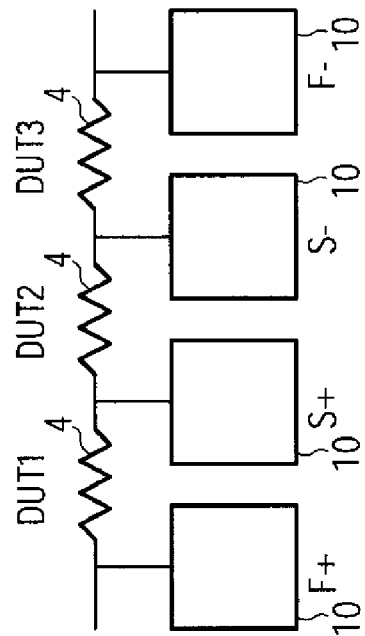
FIG. 4 schematically shows a test option in accordance with still further embodiments.

FIG. 4 shows another test option employing a four-conductor or Kelvin test option. To this end, the voltage is applied to the probe pads denoted as F+ and F− of two current path chains DUT1, DUT3 adjacent a current path chain under test DUT2 and thus a resulting current is drawn through the current path chains DUT1, DUT2, DUT3 between the probe pads F+ and F−. Sensing a voltage drop over the probe pads S+ and S− of the current path chain under test DUT2 at the same time yields the resistance of the current path chain under test DUT2.

Both test options illustrated in FIGS. 3 and 4 may be implemented in one and the same test program for optimum flexibility.

In order to carry out a stress migration test, the test structures 2 may be subjected to a predetermined temperature or to a predetermined time-temperature profile and the resistance of some or all of the current path chains 4, DUT1, DUT2, DUT3 is monitored over time to identify a failure of one of the current path chains. Further, any other test scenarios may be performed on the test structures 2.

As a result, the present disclosure describes an enhanced test structure design that is applicable to a variety of test purposes and may be employed for testing of semiconductor metallization structures on all levels in a semiconductor device. The proposed test structure is easily fabricated at any level and may be fabricated in any necessary structural dimension. For example, the overall size of the test structure may be maintained even if the metallization segments are increased or reduced in thickness by about, e.g., 10%. Since the same structure can be used on all levels of a semiconductor device, the physical failure analysis effort is drastically reduced. For example, the same type of masks may be used. Further, the same selection methods and model calculations may be used or may be used in an only slightly amended form. Further, any contacting scenario within a semiconductor device may be reasonably approximated by only two different half chains. In summary, the embodiments of test structures disclosed herein provide a good balance between electrical testability versus statistical significance. Further, illustrative embodiments enable an option of one hundred percent (100%) physical failure analysis, e.g., by optical beam induced resistance change techniques. However, it should be noted that any other known technique may be used in combination with the proposed test structure to provide reliable information about stress migration in the respective test structure. The test structures according to illustrative embodiments disclosed herein may be fabricated with any suitable technique and are therefore adaptable to any semiconductor device manufacturing techniques. Hence, the test structure according to the present disclosure is applicable for stress migration testing of any semiconductor integrated circuit device.

It should be noted that although some exemplary examples of test procedures and test techniques have been mentioned in this description, any suitable test procedure or test technique may be employed with the test structures disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A test structure comprising a current path chain having a first half chain and a second half chain, wherein:

each half chain comprises lower metallization segments, upper metallization segments, an insulating layer between the lower metallization segments and the upper metallization segments, and connection segments;

each of said connection segments is electrically connected to a contact region of one of said lower metallization segments and to a contact region of one of said upper metallization segments to thereby electrically connect the respective lower metallization segment and the respective upper metallization segment;

at least one of the first half chain or the second half chain comprises a width less than a width of a probe pad; and the first half chain and the second half chain have different configurations with different structural electrical characteristics, wherein the upper and lower metallization segments of the first half chain are different with respect to the upper and lower metallization segments of the second half chain.

2. The test structure according to claim 1, wherein, in the first half chain, each contact region is located at an end of the respective metallization segment, and in the second half chain, the metallization segments extend beyond the contact regions thereof.

3. The test structure of claim 1, wherein the connection segments comprise conductive plugs formed in contact holes of said insulating layer.

4. The test structure of claim 1, wherein the first half chain and the second half chain span a width which corresponds to a width of a probe pad.

5. The test structure of claim 1, wherein the first half chain is connected to a first probe pad and the second half chain is connected to a second probe pad.

6. The test structure of claim 1, wherein the first half chain and the second half chain are arranged in parallel.

7. The test structure of claim 1, further comprising:
   at least three of said current path chains connected in series between two terminals; and
   two further probe pads, each of which is connected between two of said current path chains.

8. The test structure of claim 1, wherein the first half chain and the second half chain span a width greater than or equal to a width approximately equal to a width of a probe pad.

9. The test structure of claim 1, wherein the first half chain and the second half chain collectively span a width less than a width of a probe pad.

10. The test structure of claim 1, further comprising at least two of said current path chains, wherein one of said half chains of a first current path chain is connected to a first probe pad and the other half chain of said first current path chain is connected to a second probe pad, and one half chain of a second current path chain is connected to the second probe pad.

11. The test structure of claim 10, wherein the first current path chain spans a width that is equal to a width of the first probe pad and the second current path chain spans a width that is equal to a width of the second probe pad.

12. The test structure of claim 1, wherein at least one of the first half chain and the second half chain are serpentine shaped having parallel chain portions.

13. The test structure of claim 12, wherein each of said chain portions of a half chain comprises three connection segments.

14. The test structure of claim 12, wherein each half chain comprises nine of said parallel chain portions.

15. The test structure of claim 12, wherein both of the first half chain and the second half chain are serpentine shaped having parallel chain portions and said chain portions of said first half chain are aligned with chain portions of the second half chain.

16. The test structure of claim 12, wherein the parallel chain portions are spaced from each other by a predetermined distance.

17. The test structure of claim 12, wherein, within each chain portion, the contact segments are spaced by a predetermined distance.

18. The test structure of claim 17, wherein the predetermined distance is approximately between 5 µm and 7 µm.

19. A test structure comprising a first current path chain having a first half chain and a second half chain, wherein:
   each half chain comprises lower metallization segments, upper metallization segments, an insulating layer between the lower metallization segments and the upper metallization segments, and connection segments;
   each of said connection segments is electrically connected to a contact region of one of said lower metallization segments and to a contact region of one of said upper metallization segments to thereby electrically connect the respective lower metallization segment and the respective upper metallization segment;
   at least one of the first half chain or the second half chain comprises a width less than a width of a probe pad;
   the first half chain and the second half chain have different configurations; and
   further comprising at least a second current path chain having a first half chain and a second half chain, wherein one of said half chains of the first current path chain is connected to a first probe pad and the other half chain of said first current path chain is connected to a second probe pad, and one half chain of the second current path chain is connected to the second probe pad, and wherein the first current path chain spans a width that is equal to a width of the first probe pad and the second current path chain spans a width that is equal to a width of the second probe pad.

* * * * *